(12) United States Patent
Park et al.

(10) Patent No.: US 12,396,112 B2
(45) Date of Patent: Aug. 19, 2025

(54) FOLDABLE DISPLAY APPARATUS

(71) Applicants: LG Display Co., Ltd., Seoul (KR); LMT Co., Ltd., Gumi-si (KR)

(72) Inventors: Jungkyu Park, Seoul (KR); Minkyung Kim, Seoul (KR); Hosung Park, Seoul (KR); SangJun Lee, Seoul (KR); Hae Woong Park, Gumi-si (KR); TaeWoo Kim, Paju-si (KR); Eunae Cho, Gimpo-si (KR)

(73) Assignees: LG Display Co., Ltd., Seoul (KR); LMT CO., LTD., Gumi-si (KR)

( * ) Notice: Subject to any disclaimer, the term of this patent is extended or adjusted under 35 U.S.C. 154(b) by 246 days.

(21) Appl. No.: 18/090,948

(22) Filed: Dec. 29, 2022

(65) Prior Publication Data

US 2023/0217616 A1   Jul. 6, 2023

(30) Foreign Application Priority Data

Dec. 31, 2021 (KR) .................. 10-2021-0194332
Dec. 22, 2022 (KR) .................. 10-2022-0181996

(51) Int. Cl.
*H05K 5/00* (2025.01)
*F16C 11/04* (2006.01)
(Continued)

(52) U.S. Cl.
CPC ............ *H05K 5/0226* (2013.01); *F16C 11/04* (2013.01); *G06F 1/1641* (2013.01); *E05D 3/122* (2013.01); *E05Y 2999/00* (2024.05)

(58) Field of Classification Search
CPC ..... H05K 5/0226; F16C 11/04; G06F 1/1641; G06F 1/1652; G06F 1/1679; G06F 1/1681; E05D 3/122; E05Y 2999/00
(Continued)

(56) References Cited

U.S. PATENT DOCUMENTS

2009/0002927 A1   1/2009 Iijima et al.
2009/0013500 A1   1/2009 Ueyama et al.
(Continued)

FOREIGN PATENT DOCUMENTS

CN   101124414 A   2/2008
CN   101334684 A   12/2008
(Continued)

OTHER PUBLICATIONS

Notice of Allowance dated May 19, 2025 issued in corresponding Chinese Patent Application No. 202211728971.9 (with English translation).

*Primary Examiner* — Zhengfu J Feng
(74) *Attorney, Agent, or Firm* — Morgan, Lewis & Bockius LLP

(57) ABSTRACT

A foldable display apparatus includes: a display panel; first and second set housings arranged in a first direction and supporting the display panel; and a hinge assembly disposed between and connected to the first and second set housings. The hinge assembly is configured to: rotate the first and second set housings inward to in-fold the display panel so that the display panel is disposed between the first set housing and the second set housing; rotate the first and second set housings outward to out-fold the display panel so that the first set housing and the second set housing are disposed between the out-folded display panel; and position the first and second set housings flat to unfold the display panel so that the display panel is flat on the first set housing, the second set housing, and the hinge assembly.

26 Claims, 10 Drawing Sheets

(51) Int. Cl.
  *G06F 1/16*     (2006.01)
  *H05K 5/02*     (2006.01)
  *E05D 3/12*     (2006.01)

(58) Field of Classification Search
  USPC ........................................................ 361/807
  See application file for complete search history.

(56)          References Cited

U.S. PATENT DOCUMENTS

2020/0056410 A1     2/2020  French et al.
2020/0363843 A1*   11/2020  Cheng .................. G06F 1/1681
2021/0165466 A1*    6/2021  Kang ..................... F16C 11/04
2021/0247815 A1*    8/2021  Shim ..................... G06F 1/1641
2021/0263565 A1*    8/2021  Yen ....................... G06F 1/1681
2021/0274028 A1*    9/2021  Park .................... H04M 1/0216
2023/0007797 A1*    1/2023  Jiang .................... G06F 1/1681
2023/0217616 A1     7/2023  Park et al.

FOREIGN PATENT DOCUMENTS

CN         211693203 U     10/2020
KR         10-1894456 B1    9/2018
KR       10-2019-0065641 A  6/2019
KR       10-2020-0005148 A  1/2020
KR       10-2023-0103985 A  7/2023
WO          2020/210987 A1  10/2020

* cited by examiner

FOLDABLE DISPLAY APPARATUS

CROSS-REFERENCE TO RELATED APPLICATIONS

This application claims the priority of Korean Patent Application No. 10-2021-0194332 filed on Dec. 31, 2021, and Korean Patent Application No. 10-2022-0181996 filed on Dec. 22, 2022, in the Korean Intellectual Property Office, the disclosure of each of which is incorporated herein by reference.

BACKGROUND

Technical Field

The present disclosure relates to a foldable display apparatus and, more particularly, to a foldable display apparatus which has a bi-directionally foldable hinge structure.

Description of the Related Art

Recently, mobile terminals, such as a wireless terminal, a personal digital assistant (PDA), a portable multimedia player (PMP), and an electronic notebook, are becoming smaller to ensure portability. However, since a user typically wants to receive various information, such as character information, videos, still images, MP3, or games, through a screen of the portable terminal, the user demands a large-sized or a wide-sized screen for the display unit. However, the reduction in the size of the portable terminal results in reduction in the size of the screen of the display unit, so that there are limitations for satisfying both requirements.

To overcome the above-mentioned limitations, recently, a flexible display apparatus, such as a bendable display apparatus or a foldable display apparatus, is being developed.

The flexible display apparatus may be implemented by configuring a substrate with a plastic material. When the flexible display apparatus is folded, it is simply carried. When the flexible display apparatus is unfolded, a large screen is implemented so that the flexible display apparatus may be applied to various fields including not only mobile equipment, such as a mobile phone, an electronic book, or electronic newspaper, but also a television or a monitor.

SUMMARY

The inventors of the present disclosure invented a structure incorporating a hinge in an area where the display panel is folded, to implement a foldable display apparatus among different types of flexible display apparatuses. However, the inventors recognized that the hinge structure of the related art could fold only in one direction, and it was difficult to implement both in-folding to position the display panel in the interior and out-folding to position the display panel in the exterior.

The inventors also recognized that, even though a hinge could implement in-folding and out-folding, it was difficult to prevent or mitigate damages to the display panel caused by repeated folding in both directions, that is, both the in-folding and the out-folding.

Accordingly, embodiments of the present disclosure are directed to a foldable display apparatus that substantially obviates one or more problems due to the limitations and disadvantages of the related art.

An object of the present disclosure is to provide a bi-directionally foldable display apparatus capable of implementing both the in-folding and the out-folding.

Another object of the present disclosure is to provide a foldable display apparatus capable of preventing or mitigating damages to the display panel caused by a pressure applied to the display panel exposed by the out-folding.

Still another object of the present disclosure is to provide a foldable display apparatus capable of preventing or mitigating an excessive stress applied to the display panel by a small radius of curvature during the in-folding and minimizing potential cracks and crease in the display panel.

Still another object of the present disclosure is to reduce a strain in the portion of the display panel to which the largest strain may be applied during the repeated in-folding and out-folding operations.

Still another object of the present disclosure is to provide a foldable display apparatus with an excellent durability even with the repeated folding.

The objects, features, and aspects of the present disclosure are not limited to those mentioned above. Additional objects, features, and aspects will be set forth in part in the description that follows and in part will become apparent to those skilled in the art from the description or may be learned by practice of the inventive concepts provided herein. Other objects, features, and aspects of the inventive concepts may be realized and attained by the structure particularly pointed out in, or derivable from, the written description, the claims hereof, and the appended drawings.

To achieve these and other advantages and in accordance with the purpose of the disclosure, as embodied and broadly described herein, a foldable display apparatus may include: a display panel; a first set housing and a second set housing arranged in a first direction and respectively supporting two different portions of the display panel; and a hinge assembly disposed between the first set housing and the second set housing and configured to fold and unfold the first set housing and the second set housing. The hinge assembly may include: a mid bar extending between the first set housing and the second set housing in a second direction perpendicular to the first direction; a first flap bar disposed between the first set housing and the mid bar; a second flap bar disposed between the second set housing and the mid bar; a fastening member fastened with the mid bar, the first flap bar, and the second flap bar; a support member coupled to the fastening member; a first cam and a second cam disposed respectively at opposite sides of the support member in the first direction and coupled respectively with the first flap bar and the second flap bar; and a first gear arm and a second gear arm coupled respectively with the first cam and the second cam and coupled respectively with the first housing and the second housing.

In another aspect of the present disclosure, a foldable display apparatus may include: a display panel; a first set housing and a second set housing arranged in a first direction and supporting the display panel; and a hinge assembly disposed between and connected to the first set housing and the second set housing. The hinge assembly may be configured to: rotate the first set housing and the second set housing inward to in-fold the display panel so that the display panel is disposed between the first set housing and the second set housing; rotate the first set housing and the second set housing outward to out-fold the display panel so that the first set housing and the second set housing are disposed between the out-folded display panel; and position the first set housing and the second set housing flat to unfold the display panel so that the display panel is flat on the first set housing, the second set housing, and the hinge assembly.

Other detailed matters of example embodiments are included in the detailed description and the drawings.

According to the present disclosure, a bi-directionally foldable display apparatus capable of implementing both in-folding and out-folding may be provided.

According to the present disclosure, a rounded rectangle corner may be formed in a folded area during the out-folding to suppress a potential damage of the display panel due to a pressure applied to the display panel.

According to the present disclosure, the display panel may be disposed with a shape of omega (Ω) during the in-folding so that a radius of curvature of the display panel in the folding area is increased to reduce the stress applied to the in-folded display panel.

According to the present disclosure, a support with a variable position may be used to support the display panel of the display area during both the out-folding and the in-folding to suppress a potential crease and cracks in the display panel.

According to the present disclosure, even though the in-folding and out-folding are repeatedly performed, the potential damage to the display panel due to the repeated folding may be minimized, and the reliability of the display apparatus may be improved.

The effects according to the present disclosure are not limited to the example effects described above, and various additional effects may be included in the present disclosure or may be achieved by the practice of the present disclosure.

It is to be understood that both the foregoing general description and the following detailed description of the present disclosure are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure. In the drawings.

DETAILED DESCRIPTION

Figure 1:
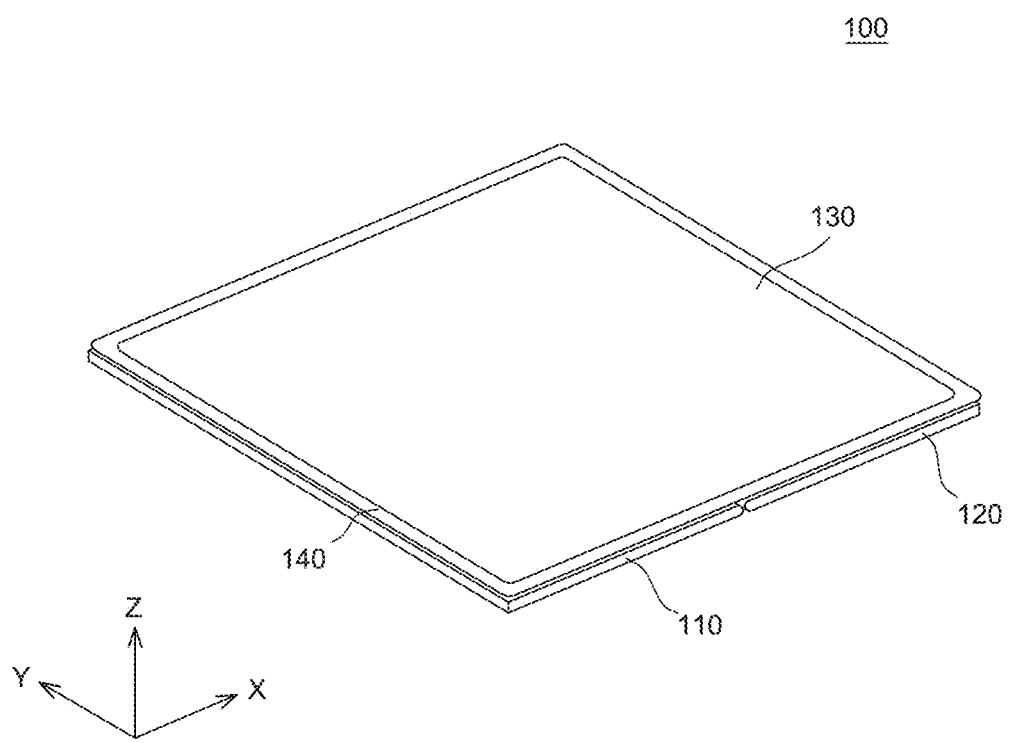
FIG. 1 is a perspective view of a foldable display apparatus according to an example embodiment of the present disclosure.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

The shapes, sizes, ratios, angles, numbers, and the like, which are illustrated in the drawings to describe various example embodiments of the present disclosure, are merely given by way of example. Therefore, the present disclosure is not limited to the illustrations in the drawings. Like reference numerals generally denote like elements throughout the specification, unless otherwise specified.

In the following description, where the detailed description of the relevant known function or configuration may unnecessarily obscure a feature or aspect of the present disclosure, a detailed description of such known function of configuration may be omitted.

Where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is to be construed as including an error or tolerance range even where no explicit description of such an error or tolerance range is provided.

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween.

Where an element or layer is referred to as being "on" or "connected to" another element or layer, it should be understood to mean that the element or layer may be directly on or directly connected to the other element or layer, or that intervening elements or layers may be present, unless otherwise specified. Also, where one element is referred to as being disposed "on" or "under" another element, it should be understood to mean that the elements may be so disposed to directly contact each other, or may be so disposed without directly contacting each other, unless otherwise specified.

Although the terms "first," "second," A, B, (a), (b), and the like may be used herein to describe various elements, these elements should not be interpreted to be limited by these terms as they are not used to define a particular order or precedence. These terms are used only to distinguish one element from another. For example, a first element could be termed a second element, and, similarly, a second element could be termed a first element, without departing from the scope of the present disclosure.

A size and a thickness of each component illustrated in the drawing are illustrated for convenience of description, and the present disclosure is not limited to the illustrated size and thickness of the component.

Features of various embodiments of the present disclosure may be partially or entirely coupled to or combined with each other. They may be linked and operated technically in various ways as those skilled in the art can sufficiently understand. The embodiments may be carried out independently of or in association with each other in various combinations.

Hereinafter, a foldable display apparatus according to example embodiments of the present disclosure will be described in detail with reference to accompanying drawings.

Figure 2:
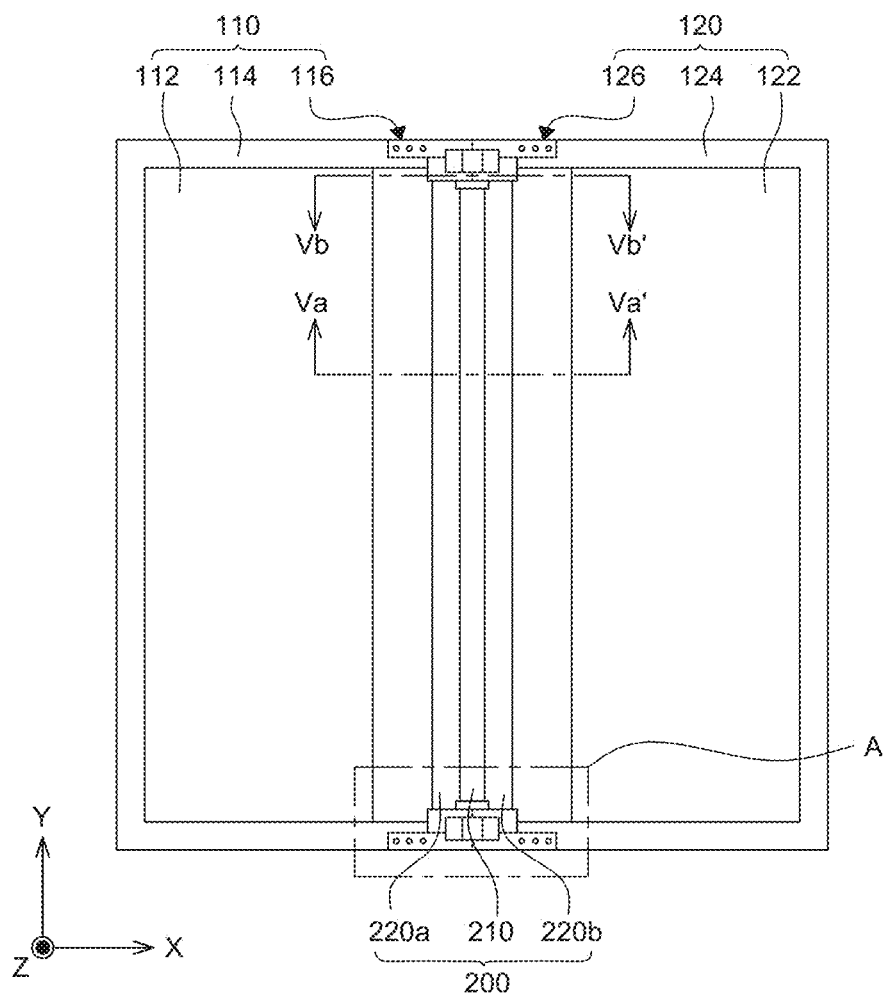
FIG. 2 is a plan view of a partial configuration of a foldable display apparatus according to an example embodiment of the present disclosure.

FIGS. 1 and 2 are views for explaining a foldable display apparatus according to an example embodiment of the present disclosure. FIG. 1 is a perspective view of a foldable display apparatus according to an example embodiment of the present disclosure, and FIG. 2 is a plan view of a partial configuration of a foldable display apparatus according to an example embodiment of the present disclosure.

As illustrated in FIGS. 1 and 2, a foldable display apparatus 100 according to an example embodiment of the present disclosure may include set housings 110 and 120, a hinge assembly 200, a display panel 130, and a bezel cover 140.

In FIGS. 1 and 2, even though components of the foldable display apparatus 100 are generally illustrated without more details for the convenience of description, various additional components for driving the foldable display apparatus 100 may be further included.

The foldable display apparatus 100 according to an example embodiment of the present disclosure may be folded to a specific angle as intended by the user. Further, the foldable display apparatus may be fully folded or unfolded as intended by the user. The foldable display apparatus may be inwardly folded (in-folded) to position the display panel in the interior, may be outwardly folded (out-folded) to position the display panel in the exterior, and may be unfolded in either direction. The foldable display apparatus 100 according to an example embodiment of the present disclosure may be a bi-directionally foldable display apparatus in which in-folding and out-folding may be readily implemented according to the intention of the user.

The set housings 110 and 120 may be external covers of the set to support or accommodate various components of the foldable display apparatus 100 including the display panel 130. The set housings 110 and 120 may be configured by a first housing frame 120 at the left side and a second housing frame 120 at the right side, but they are not limited thereto.

The first set housing 110 and the second set housing 120 may be spaced apart from each other with the hinge assembly 200 therebetween. The first set housing 110 and the second set housing 120 may be disposed across from each other with the hinge assembly 200 interposed therebetween in a width direction (an X-axis direction or a first direction). Further, the first set housing 110 and the second set housing 120 may be disposed respectively in one area and the other area of the foldable display apparatus 100 according to an example embodiment of the present disclosure where folding and unfolding may be performed. That is, the foldable display apparatus 100 according to an example embodiment of the present disclosure may be folded or unfolded at a boundary area between the first set housing 110 and the second set housing 120 by an external force applied by a user to perform the folding and unfolding movements.

As shown in FIG. 2, each of the set housings 110 and 120 may include a support, a frame, and a fastening unit. Specifically, the first set housing 110 may include a first support 112, a first frame 114, and a first fastening unit 116, and the second set housing 120 may include a second support 122, a second frame 124, and a second fastening unit 126.

The first support 112 and the second support 122 may be base members for supporting various components of the foldable display apparatus 100 including the display panel 130. The first support 112 and the second support 122 may be spaced apart from each other with a mid bar 210, a first flap bar 220a, and a second flap bar 220b of the hinge assembly 200 therebetween.

The first frame 114 and the second frame 124 may be embedded frames of the set to enclose and accommodate various components of the foldable display apparatus 100. The first frame 114 and the second frame 124 may enclose edges of the first support 112 and the second support 122, respectively. Specifically, the first frame 114 may enclose three edges of the first support 112 excluding an edge facing the hinge assembly 200. Further, the second frame 124 may enclose three edges of the second support 122 excluding an edge facing the hinge assembly 200.

The support and the frame may be separately provided to be assembled or may have one single integrated structure to continuously connect the support and the frame. Even though FIG. 2 illustrates the first support 112 and the first frame 114 as one continuous single structure and the second support 122 and the second frame 124 as one continuous single structure, they are not limited thereto.

A first fastening unit 116 and a second fastening unit 126 may be coupled to the hinge assembly 200 and may be formed in the first frame 114 and the second frame 124, respectively. The first fastening unit 116 may be formed on an upper edge and a lower edge of the first frame 114 adjacent to the first flap bar 220a. The second fastening unit 126 may be formed on an upper edge and a lower edge of the second frame 124 adjacent to the second flap bar 220b. The first fastening unit 116 and the second fastening unit 126 may be fastened, respectively, with a first gear arm 290a and a second gear arm 290b (see, e.g., FIG. 3) of the hinge assembly 200 to be described below. The first fastening unit 116 and the second fastening unit 126 may be disposed to be face to each other during the folding.

The hinge assembly 200 may be connected to the first set housing 110 and the second set housing 120 to implement the folding and unfolding movements of the foldable display apparatus 100. The hinge assembly 200 may include a mid bar 210 and flap bars 220a and 220b. A specific structure and function of the hinge assembly 200 will be described below in more detail with reference to FIGS. 3, 4A, and 4B.

The display panel 130 may be disposed on the first set housing 110 and the second set housing 120. Specifically, the display panel 130 may be disposed on one surface of the first support 112 and the second support 122. The display panel 130 may be one of various types of display panels 130, such as an organic light emitting display panel or a liquid crystal display panel.

Even though not illustrated in the drawings, the display panel 130 may be configured for displaying images to the user and may include a plurality of sub pixels. In the display panel 130, the plurality of scan lines and the plurality of data lines may intersect each other, and each of the plurality of sub pixels may be connected to a corresponding scan line and a corresponding data line. In addition, each of the plurality of sub pixels may be connected to one or more of a high potential power line, a low potential power line, an initialization signal line, and an emission control signal line.

The sub pixel may be a minimum unit which configures a display screen, and each of the plurality of sub pixels may include a light emitting diode and a pixel circuit for driving the light emitting diode. The plurality of light emitting diodes may be defined in different ways depending on a type of the display panel 130. For example, if the display panel 130 is an organic light emitting display panel, the light emitting diode may be an organic light emitting diode which includes an anode, a light emitting unit, and a cathode. Hereinafter, even though the description will be made for an example in which the light emitting diode is the organic light emitting diode, the type of the light emitting diode is not limited thereto.

A pixel circuit is a circuit for controlling the driving of the light emitting diode. For example, the pixel circuit may be configured to include a plurality of transistors and a capacitor, but it is not limited thereto.

Further, the display panel 130 may have flexibility so as to be folded and unfolded in accordance with the folding and unfolding of the foldable display apparatus 100.

The foldable display apparatus 100 may be folded such that the first set housing 110 and the second set housing 120 form any specific folding angle. That is, although in FIGS. 1 and 2, the first set housing 110 and the second set housing 120 are illustrated as fully unfolded at 180°, the foldable display apparatus 100 may be folded at any specific angle. In this case, the display panel 130 on which the first set housing 110 and the second set housing 120 are disposed may also be folded at any specific angle together with the folding and unfolding of the first set housing 110 and the second set housing 120.

Further, the foldable display apparatus 100 may maintain a specific folding angle by the holding force supplied from the hinge assembly 200. That is, the first set housing 110 and the second set housing 120 may be fixed while maintaining a specific folding angle by the hinge assembly 200. Therefore, the foldable display apparatus 100 may be folded at a specific angle as intended by the user and may maintain a folded state at the specific angle by the holding force of the hinge assembly 200.

The bezel cover 140 may cover an upper bezel of the display panel 130 on the upper surface of the display panel 130. The bezel cover 140 may be integrally formed to cover all the bezel of the display panel 130, but it is not limited thereto. That is, the bezel cover 140 may be configured as being divided into a first bezel cover at the left side and a second bezel cover at the right side.

Hereinafter, the specific structure and function of the hinge assembly 200 will be described in more detail with reference to FIGS. 3, 4A, and 4B.

Figure 3:
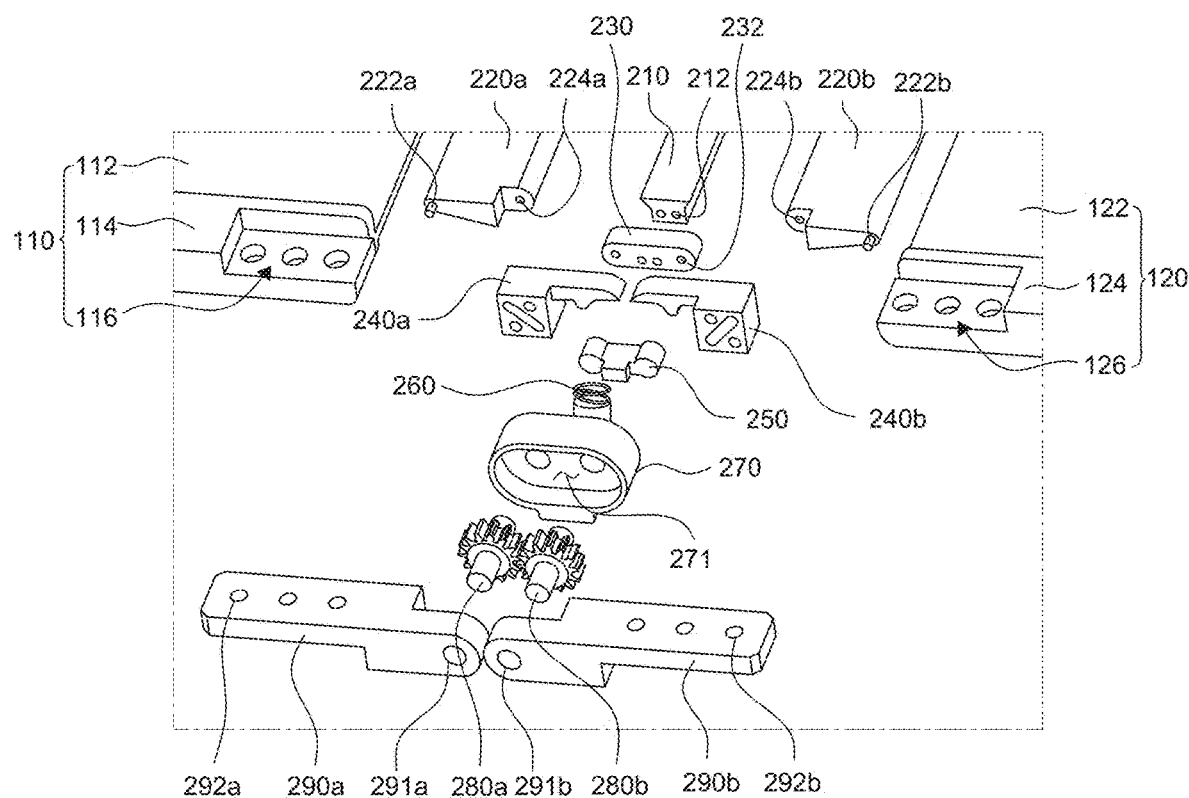
FIG. 3 is an exploded perspective view enlarging a portion "A" of FIG. 2.

FIG. 3 is an exploded perspective view enlarging the portion "A" of FIG. 2. FIG. 3 illustrates an exploded perspective view of a portion of a hinge assembly 200. FIG. 4A is a perspective view illustrating a first cam structure of a foldable display apparatus according to an example embodiment of the present disclosure. FIG. 4B is a perspective view illustrating a support member and a gear housing of a foldable display apparatus according to an example embodiment of the present disclosure. FIG. 5A is a cross-sectional view taken along the line Va-Va' of FIG. 2. FIG. 5B is a cross-sectional view taken along the line Vb-Vb' of FIG. 2.

Figure 4A:
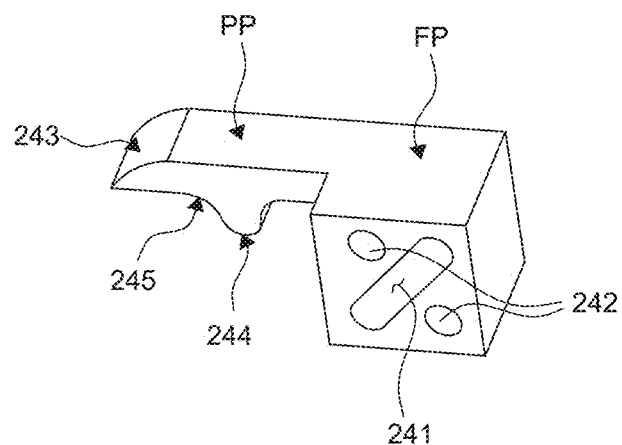
FIG. 4A is a perspective view illustrating a first cam structure of a foldable display apparatus according to an example embodiment of the present disclosure.
Figure 4B:
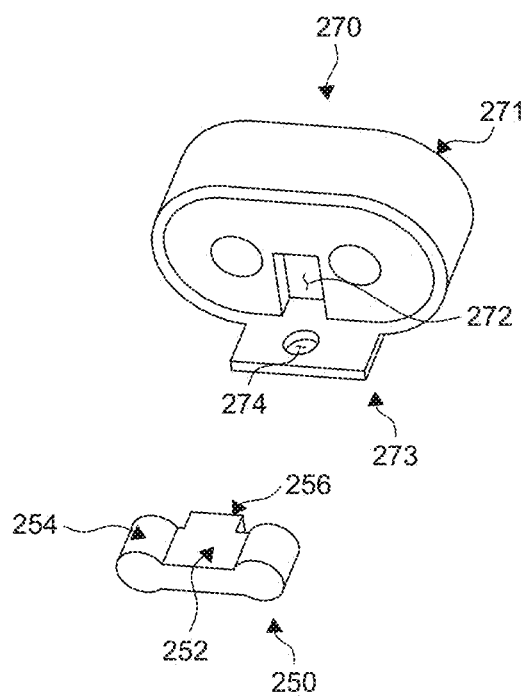
FIG. 4B is a perspective view illustrating a support member and a gear housing of a foldable display apparatus according to an example embodiment of the present disclosure.
Figure 5A:
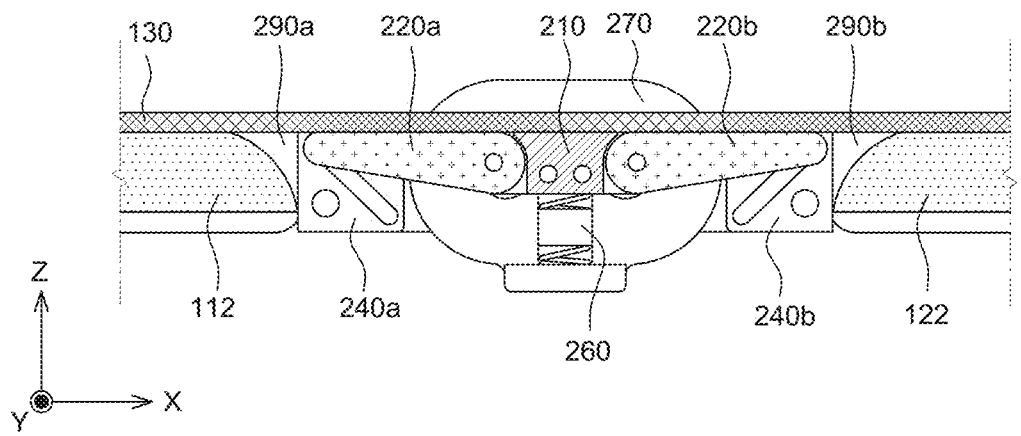
FIGS. 5A and 5B are schematic cross-sectional views illustrating an unfolded state of a foldable display apparatus according to an example embodiment of the present disclosure.
Figure 5B:
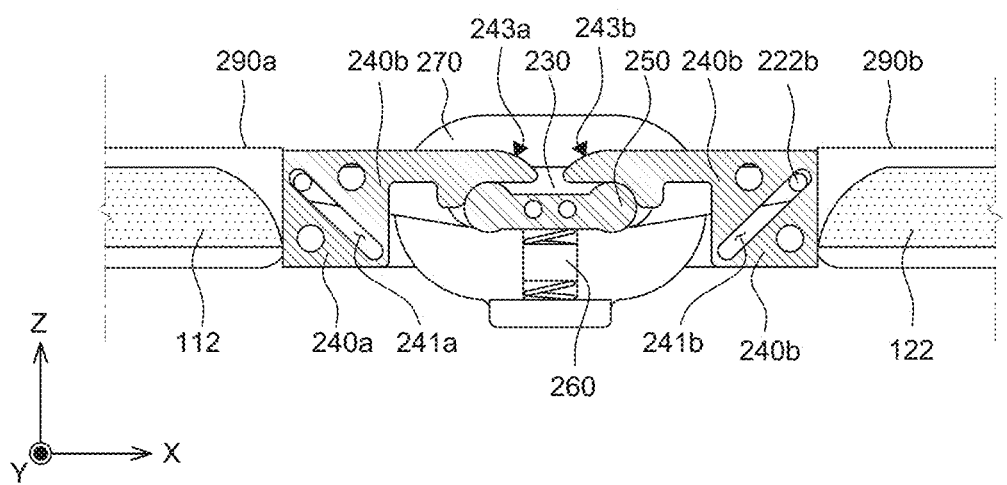

As shown in FIGS. 3, 4A, and 4B, the hinge assembly 200 according to an example embodiment of the present disclosure may include a mid bar 210, a first flap bar 220a, a second flap bar 220b, a fastening member 230, a first cam 240a, a second cam 240b, a support member 250, a spring member 260, a gear housing 270, a first rotary gear 280a, a second rotary gear 280b, a first gear arm 290a, and a second gear arm 290b.

As illustrated in FIG. 2, the mid bar 210 may be disposed between the first set housing 110 and the second set housing 120. The mid bar 210 may be elongated in the length direction (a Y-axis direction or a second direction). The mid bar 210 may have a flat upper surface so as to support the display panel 130.

As shown in FIG. 3, both sides of the mid bar 210 in the width direction (the X-axis direction or the first direction) may have inwardly recessed surfaces so as to correspond to convex surfaces formed on one side of the first flap bar 220a and the second flap bar 220b, respectively. The curved surface at each side of the mid bar 210 may have a shape corresponding to a circular arc formed respectively on one side of the first flap bar 220a and the second flap bar 220b.

Two first insertion holes 212 may be formed on both sides of the mid bar 210 in the length direction (the Y-axis direction). The first insertion hole 212 may be fastened with the fastening member 230 adjacent thereto in the length direction (the Y-axis direction), by a pin (not shown).

The mid bar 210 may move up and down in the thickness direction (the Z-axis direction or a third direction). The mid bar 210 may move up and down depending on whether the first set housing 110 and the second set housing 120 are folded. The up-down movement of the mid bar 210 will be described below in more detail in the context of an example folding of the foldable display apparatus according to an example embodiment of the present disclosure.

The first flap bar 220a and the second flap bar 220b may be disposed at respective sides of the mid bar 210 in the width direction (X-axis direction). As shown in FIG. 2, the first flap bar 220a may be disposed between the mid bar 210 and the first set housing 110, and the second flap bar 220b may be disposed between the mid bar 210 and the second set housing 120. The first flap bar 220a and the second flap bar 220b may support a part of the display panel 130 and may serve as a hinge. The first flap bar 220a and the second flap bar 220b may rotate around a rotation axis along the length direction (the Y-axis direction) located at a respective side adjacent to the mid bar 210.

The first flap bar 220a and the second flap bar 220b may have a wing shape. As illustrate in FIG. 3, the first flap bar 220a and the second flap bar 220b may be form formed such that the thickness is reduced from the inner side to the outer side in the width direction (the X-axis direction). The first flap bar 220a and the second flap bar 220b may implement a movement in which a thin outer side rotates around a rotation axis located at the thick inner side.

The respective sides of the first flap bar 220a and the second flap bar 220b adjacent to the mid bar 210 may have convex surfaces. As shown in FIG. 3, a right side of the first flap bar 220a and a left side of the second flap bar 220b may have convex surfaces. The right side of the first flap bar 220a and the left side of the second flap bar 220b may form a circular arc with respect to the respective rotation axis.

Curved surfaces formed on the respective side portions of the first flap bar 220*a* and the second flap bar 220*b* may correspond to the corresponding side surfaces of the mid bar 210. Convex surfaces formed on respective side portions of the first flap bar 220*a* and the second flap bar 220*b* may each at least partially correspond to the concave surface formed on the corresponding side portion of the mid bar 210. A center axis of the convex surfaces formed on the respective side portions of the first flap bar 220*a* and the second flap bar 220*b* may each at least partially correspond to the concave surface formed on the corresponding side surface of the mid bar 210.

The other (opposite) sides of the first flap bar 220*a* and the second flap bar 220*b* away from the mid bar 210 and adjacent respectively to the first set housing 110 and the second set housing 120 may have various shapes. Even though FIG. 3 illustrates a structure in which the respective other sides of the first flap bar 220*a* and the second flap bar 220*b* adjacent to the first set housing 110 and the second set housing 120 form a circular arc having a smaller radius of curvature than the respective sides adjacent to the mid bar 210, it is not limited thereto. That is, the respective other sides of the first flap bar 220*a* and the second flap bar 220*b* may form curved surfaces or may have a rectangular or a polygonal shape.

Second insertion holes 224*a* and 224*b* may be formed at the respective sides of the first flap bar 220*a* and the second flap bar 220*b* adjacent to the mid bar 210 in the width direction (X-axis direction) and may be fastened with the fastening member 230 adjacent in the length direction (Y-axis direction). The second insertion holes 224*b* may be fastened with the fastening member 230 adjacent in the length direction (the Y-axis direction) with pins (not illustrated). The first flap bar 220*a* and the second flap bar 220*b* may interwork with the mid bar 210 connected to the fastening member 230.

Sliding pins 222*a* and 222*b* may be formed in the length direction (Y axis direction) at respective side portions of the first flap bar 220*a* and the second flap bar 220*b* adjacent to the first set housing 110 and the second set housing 120. The sliding pins 222*a* and 222*b* may be inserted into the corresponding guide holes 241 of the cams 240*a* and 240*b* to slide along the guide holes 241. The sliding pins 222*a* and 222*b* may be integrally formed with the first set housing 110 and the second set housing 120, respectively, and may be pins inserted respectively into third insertion holes (not shown) formed in the first and second flap bars 220*a* and 220*b*.

The fastening member 230 may be disposed adjacent to one end of the mid bar 210 in the length direction (Y-axis direction). As shown in FIG. 3, the fastening member 230 may have four fourth insertion holes 232. Among them, two fourth insertion holes located toward the center may be respectively fastened with the first insertion holes 212 of the mid bar 210. The two remaining fourth insertions holes may be located toward lateral sides and may be fastened with the second insertion holes 224*a* and 224*b* of the first flap bar 220*a* and the second flap bar 220*b*, respectively. The mid bar 210, the first flap bar 220*a*, and the second flap bar 220*b* may be linked by the fastening member 230 to interwork with each other.

The two fourth insertion holes located near the center of the fastening member 230 may be fastened with the support member 250. That is, the two fourth insertion holes located near the center of the fastening member 230 may be fastened with the mid bar 210 at one side in the length direction (Y axis direction) and may be fastened with the support member 250 at the other side. Accordingly, the mid bar 210 may interwork with the support member 250.

The support member 250 may be disposed at one side of the fastening member 230 in the length direction (Y-axis direction). The support member 250 may move up and down in accordance with the rotation of the cam to be described below. Further, the support member 250 may be coupled to the fastening member 230 at one side and may be in contact with the gear housing 270 at the other side.

As shown in FIG. 4B, the support member 250 may include a flat portion 252, circular arc portions 254, and a protruding portion 256. The flat portion 252 may be located at the center of the upper surface of the support member 250 and may be in contact with the first protruding portions 243 (see FIG. 4A) of the first cam 240*a* and the second cam 240*b* based on the rotation of the first cam 240*a* and the second cam 240*b* to be described below. The circular arc portions 254 may be located on both sides of the flat portion 252 and may have convex surfaces. That is, the circular arc portions 254 may each form a circular arc with respect to the center axis. The circular arc portions 254 may be in contact respectively with the curved portions 245 (see FIG. 4A) of the first cam 240*a* and the second cam 240*b* to be described below. The circular arc portions 254 may be in contact respectively with the curved portions 245 of the first cam 240*a* and the second cam 240*b* to support the first cam 240*a* and the second cam 240*b* when the first cam 240*a* and the second cam 240*b* rotate. The protruding portion 256 may have a shape protruding toward the gear housing 270. The protruding portion 256 may be inserted into the guide groove 272 formed in the gear housing 270 and may move up and down in the gear housing 270.

The first cam 240*a* and the second cam 240*b* may be disposed at both sides of the support member 250 in the width direction (X-axis direction). As shown in FIG. 4A, each of the first cam 240*a* and the second cam 240*b* may include a fixing portion FP and a pressurizing portion PP.

The fixing portions FP may be coupled to adjacent first and second flap bars 220*a* and 220*b* and the first and second gear arms 290*a* and 290*b*, respectively. Specifically, the fixing portion FP may include a guide hole 241 and fastening holes 242. Sliding pins 222*a* and 222*b* of the first and second flap bars 220*a* and 220*b* may be inserted into the respective guide holes 241 of the first and second cams 240*a* and 240*b*. When the first cam 240*a* and the second cam 240*b* rotatably move, the sliding pins 222*a* and 222*b* each move along the corresponding guide hole 241 of the fixing portion FP so that the first flap bar 220*a* and the second flap bar 220*b* may rotatably move with a margin. A plurality of fastening holes 242 may be provided. For example, as illustrated in FIG. 4A, two fastening holes 242 may be provided with the guide hole 241 therebetween to be spaced apart from the guide hole 241 with the same interval. The fastening holes 242 may be fastened with the first and second gear arms 290*a* and 290*b* by means of the fastening pins (not shown).

The pressurizing portion PP may apply pressure to the upper surface of the support member 250 disposed between the first cam 240*a* and the second cam 240*b* as the first cam 240*a* and the second cam 240*b* rotatably move. As shown in FIG. 4A, the pressurizing portion PP may include a first protruding portion 243, a second protruding portion 244, and a curved portion 245.

The first protruding portion 243 may be elongated from the fixing portion FP in the width direction (X-axis direction) in the unfolded state of the foldable display apparatus. That is, the first protruding portion 243 may be a portion extending from the fixing portion FP toward the adjacent support member 250. The first protruding portion 243 may downwardly apply a pressure to a flat portion 252 of the support member 250 by the rotational movement of the first cam 240a and the second cam 240b so that the support member 250 may downwardly move. That is, the up-down movement of the support member 250 may be implemented by the motion of the first protruding portion 243.

The second protruding portion 244 may have a structure extending in the thickness direction (Z-axis direction). The curved portion 245 may be formed between the first protruding portion 243 and the second protruding portion 244. The curved portion 245 may correspond to the corresponding circular arc portion 254 of the support member 250. The curved portion 245 may have a concave surface. The curved portion 245 may be in contact with the corresponding circular arc portion 254 of the support member 250. When the first cam 240a and the second cam 240b rotate, the respective curved portions 245 rotatably move while supporting the corresponding circular arc portions 254. The motion of the first cam 240a and the second cam 240b in the in-folded, out-folded, and unfolded states will be described below in more detail with reference to FIGS. 5A to 7B.

The spring member 260 may be disposed on a lower surface of the flat portion 252 (see FIG. 4B) of the support member 250 and may be disposed on the support unit 273 (see FIG. 4B) of the gear housing 270 to transmit an upward pressure to the support member 250. When the support member 250 downwardly moves by the rotational movement of the first cam 240a and the second cam 240b, the spring member 260 may transmit a pressure to restore the support member 250 to its original position.

The gear housing 270 may be disposed at the outer side of the support member 250 in the length direction (Y-axis direction). The gear housing 270 may accommodate and protect the first rotary gear 280a and the second rotary gear 280b and may support the adjacent spring member 260.

As shown in FIGS. 3 and 4B, the gear housing 270 may include an accommodation unit 271, a guide groove 272, a support unit 273, and a fixing groove 274. The accommodation unit 271 may be formed at one side of the gear housing 270 in the length direction (Y-axis direction) to accommodate the first rotary gear 280a and the second rotary gear 280b. The guide groove 272 may be formed on an opposite surface to the accommodation unit 271, that is, in the other side of the gear housing 270 in the length direction (Y-axis direction). The guide groove 272 may have a partially recessed shape. The guide groove 272 may be formed to extend in the thickness direction (Z-axis direction) but is not limited thereto. The protruding portion 256 of the support member 250 may be inserted into the guide groove 272 and may move up and down within the groove 272. The support unit 273 may be located below a surface on which the guide groove 272 is formed. The support unit 273 may have a plate shape extending from the other side of the gear housing 270 toward the support member 250. A fixing groove 274 may be formed in the support unit 273. The spring member 260 may be inserted into the fixing groove 274 to be fixed.

The support unit 273 and the fixing groove 274 of the gear housing 270 may allow the spring member 260 to transmit the pressure to the support member 250 without being deviated by the external impact during the movement. Further, the guide groove 272 of the gear housing 270 may allow the support member 250 to consistently move up and down without being deviated.

The first rotary gear 280a and the second rotary gear 280b may be disposed in the gear housing 270. The first rotary gear 280a and the second rotary gear 280b may serve as rotation axes around which the first gear arm 290a and the second gear arm 290b coupled respectively to the first set housing 110 and the second set housing 120 respectively rotate. As shown in FIG. 3, the first rotary gear 280a and the second rotary gear 280b may have a circular cross-section in the edge portions and a tooth form in the center portions. The first rotary gear 280a and the second rotary gear 280b may be engaged with each other. The rotary gear illustrated in FIG. 3 is a bi-axial gear which is configured by two rotary gears, but is the present disclosure is not limited thereto. For example, an example embodiment may employ a four-axial gear which is configured by four rotary gears.

The first gear arm 290a and the second gear arm 290b may be disposed at the respective outer side of the first rotary gear 280a and the second rotary gear 280b in the length direction (Y-axis direction). The first gear arm 290a and the second gear arm 290b couple the hinge assembly 200 to the first set housing 110 and the second set housing 120, respectively, to fold and unfold the first set housing 110 and the second set housing 120 with respect to the hinge assembly 200.

As shown in FIG. 3, the first gear arm 290a and the second gear arm 290b may include fastening holes 291a and 291b which may be coupled respectively to the first rotary gear 280a and the second rotary gear 280b and fastening units or holes 292a and 292b coupled respectively to the first set housing 110 and the second set housing 120. The first gear arm 290a and the second gear arm 290b may rotate as the first rotary gear 280a and the second rotary gear 280b rotate with respect to a pair of rotation axes, respectively. The fastening units 292a and 292b of the first gear arm 290a and the second gear arm 290b may be fastened with the respective first fastening units 116 of the first set housing 110 and the second fastening unit 126 of the second set housing 120. Therefore, the set housing and other components accommodated in the set housing may be folded and unfolded depending on the movement of the hinge assembly 200.

Hereinafter, an example structure and movement of main components of the hinge assembly 200 when the foldable display apparatus 100 is folded and unfolded will be described in more detail with reference to FIGS. 5A to 7B.

Figure 6A:
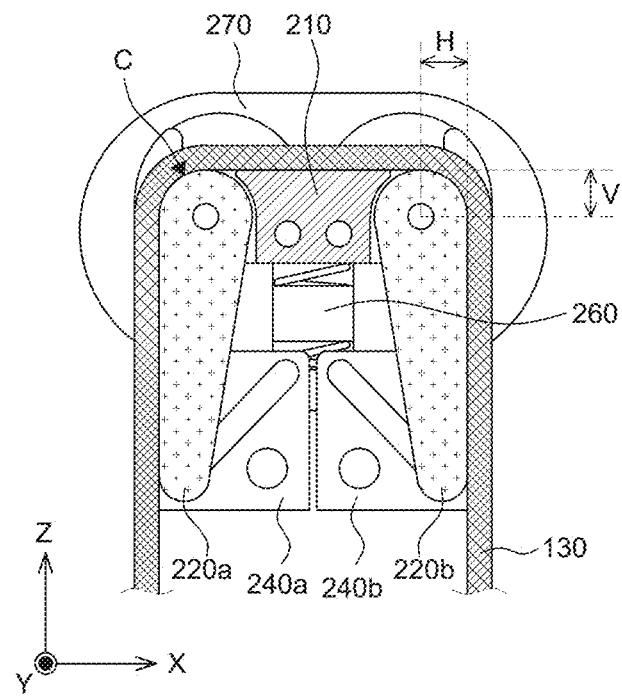
FIGS. 6A and 6B are schematic cross-sectional views illustrating an out-folded state of a foldable display apparatus according to an example embodiment of the present disclosure.
Figure 6B:
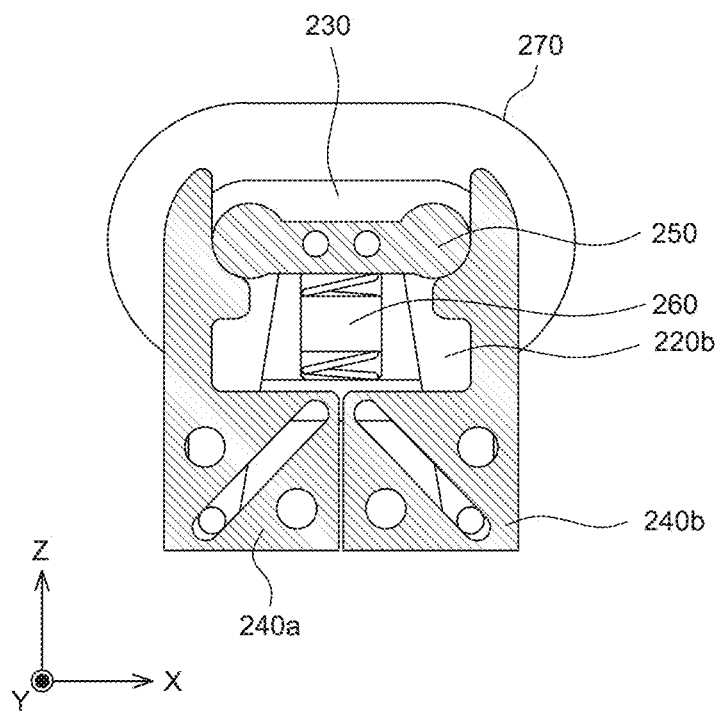
Figure 7A:
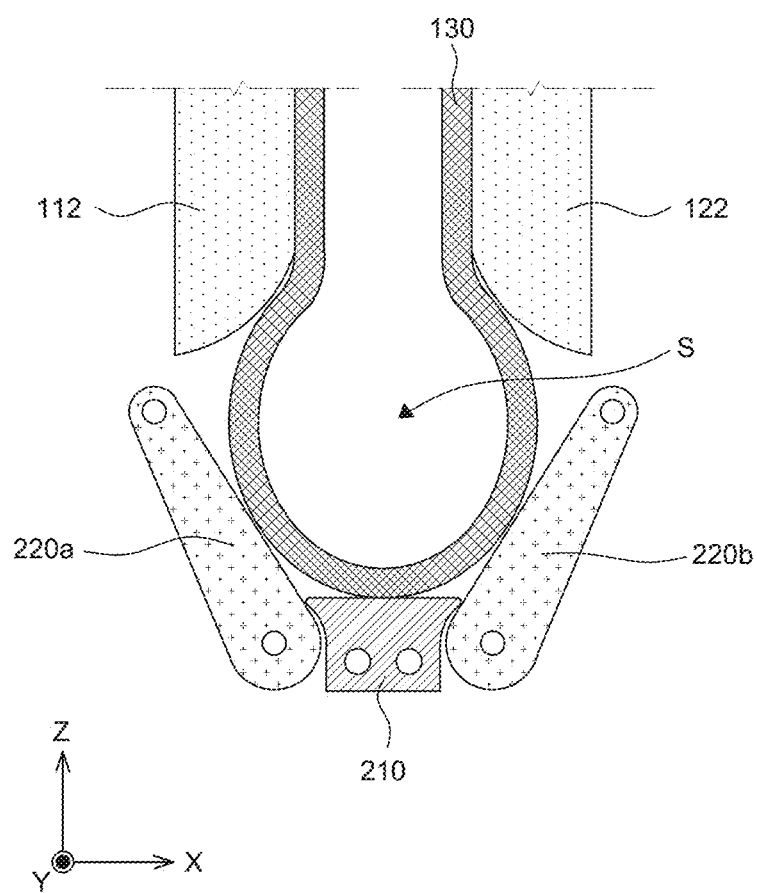
FIGS. 7A and 7B are schematic cross-sectional views illustrating an in-folded state of a foldable display apparatus according to an example embodiment of the present disclosure.
Figure 7B:
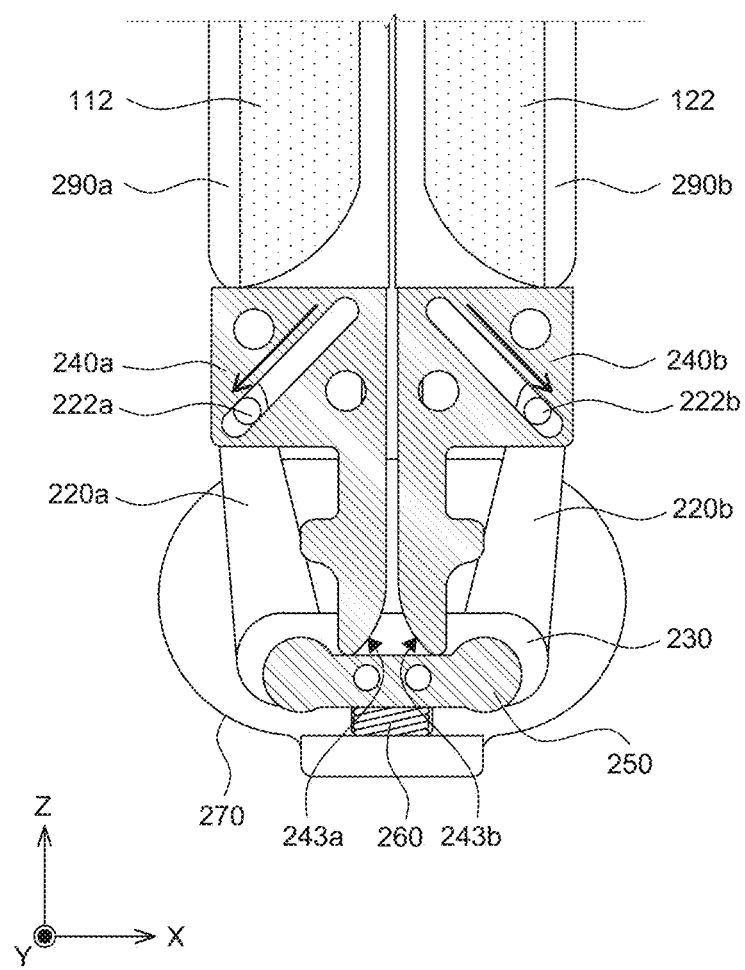

FIGS. 5A and 5B are schematic cross-sectional views illustrating an unfolded state of a foldable display apparatus according to another example embodiment of the present disclosure. FIG. 5A is a cross-sectional view taken along the line Va-Va' of FIG. 2. FIG. 5B is a cross-sectional view taken along the line Vb-Vb' of FIG. 2. FIGS. 6A and 6B are schematic cross-sectional views illustrating an out-folded state of a foldable display apparatus according to an example embodiment of the present disclosure. FIGS. 7A and 7B are schematic cross-sectional views illustrating an in-folded state of a foldable display apparatus according to an example embodiment of the present disclosure.

The example foldable display apparatus illustrated in FIGS. 5A and 5B may be unfolded, that is, the first set housing 110 and the second set housing 120 (see FIG. 2) may be fully unfolded at an angle of 180°.

As shown in FIGS. 5A and 5B, the first set housing 110 and the second set housing 120 may be fully unfolded at 180°. The first cam 240a and the second cam 240b coupled respectively to the first set housing and the second set housing may be fully unfolded at 180°, and the first protrusion portions 243a and 243b of the first cam 240a and the second cam 240b may not be in contact with the flat portion 252 (see FIG. 4B) of the support member 250. Therefore, the mid bar 210 coupled to the fastening member 230 together with the support member 250 may be disposed on the same plane as the adjacent first flap bar 220a and second flap bar 220b by an elastic force of the spring member 260. Thus, as illustrated in FIG. 5A, the mid bar 210, the first flap bar 220a, and the second flap bar 220b may form a substantially flat upper surface, and the display panel 130 located on the set housing, the mid bar 210, the first flap bar 220a, and the second flap bar 220b may also maintain the flat state.

The example foldable display apparatus illustrated in FIGS. 6A and 6B may be out-folded, that is, the first set housing and the second set housing may be fully folded back so that the display panel is disposed at the outer side.

As shown in FIGS. 6A and 6B, the first set housing 110 and the second set housing 120 (see FIG. 2) may be downwardly folded by approximately 90° with respect to the unfolded state illustrated in FIGS. 5A and 5B so that the display panel 130 is disposed at the outer side. As illustrated in FIG. 6B, the first cam 240a and the second cam 240b coupled to the first set housing and the second set housing may also be folded downwardly at approximately 90°, while supporting the circular arc portion 254 (see FIG. 4B) of the support member 250. The first flap bar 220a and the second flap bar 220b coupled by means of the guide holes 241 (see FIG. 4A) of the first cam 240a and the second cam 240b may also be downwardly folded by approximately 90°. As illustrated in FIGS. 6A and 6B, the first protruding portions 243a and 243b (see FIG. 4A) of the first cam 240a and the second cam 240b may not be in contact with the flat portion 252 (see FIG. 4B) of the support member 250. Therefore, as illustrated in FIGS. 6A and 6B, the mid bar 210 coupled to the fastening member 230 together with the support member 250 may not move up or down by the elastic force of the spring member 260, but instead may maintain its original position. Here, the first flap bar 220a and the second flap bar 220b may be downwardly folded so that the display panel 130 may be outwardly and downwardly folded by approximately 90° along a curved surface of the respective side portions of the first flap bar 220a and the second flap bar 220b from the upper surface of the mid bar 210.

Here, the display panel 130 at the folding area may be supported by the mid bar 210 so that the dent of the display panel 130 may be suppressed even by the external impact and the pressure during the out-folding. Further, as shown in FIG. 6A, the respective side portions of the first flap bar 220a and the second flap bar 220b adjacent to the mid bar 210 may maintain a curved shape C rather than an angular shape. A rounded rectangle may be formed by folding the first flap bar 220a and the second flap bar 220b. Accordingly, the mid bar 210 and the display panel 130 disposed along the upper surfaces of the first flap bar 220a and the second flap bar 220b may be folded along a curved shape so that a potential crack and crease in the folding area may be minimized even though the out-folding is repeatedly implemented.

As shown in FIG. 6A, also during the out-folding, a length V of the flap bars 220a and 220b from the rotation axis in an upper direction or vertical direction (the Z-axis direction) and a length H in the lateral direction or horizontal direction (the X-axis direction) may satisfy the following Equation 1. A stress concentrated on the display panel may vary depending on a size of the corner to which the display panel 130 is in direct contact during the out-folding.

$$\sqrt{1-\left(\frac{H}{V}\right)^2} = 0 \text{ or } 0.7 \leq \sqrt{1-\left(\frac{H}{V}\right)^2}.$$ [Equation 1]

If the length V of the flap bars 220a and 220b from the rotation axis in the upper direction is larger than the length H in the lateral direction, a stress applied to a portion in contact with the flap bars 220a and 220b while the display panel 130 is out-folded may be reduced. In contrast, if the length H of the flap bars 220a and 220b from the rotation axis in the lateral direction is larger than the length V in the upper direction, a stress applied to a center portion of the display panel overlapping the support member 250 may be reduced. That is, the length H of the flap bars 220a and 220b from the rotation axis in the lateral direction and the length V in the upper direction may have a trade-off relationship so that the length may be set by considering the overall stress applied to the entire display panel. If the length H of the flap bars 220a and 220b from the rotation axis in the lateral direction and the length V in the upper direction satisfy the range of Equation 1, a stress applied to the display panel during the out-folding may be entirely lowered, so that the performance of the display panel may be maintained for a long time.

FIGS. 7A and 7B illustrate the example foldable display apparatus illustrated in an in-folded state, that is, the first set housing 110 and the second set housing 120 are fully in-folded so that the display panel 130 is disposed between the first and second set housings.

As shown in FIGS. 7A and 7B, the first set housing 110 and the second set housing 120 may be upwardly folded by approximately 90° with respect to the unfolded state illustrated in FIGS. 5A and 5B so that the display panel 130 is disposed in the interior between the first and second set housings. As illustrated in FIG. 7B, the first cam 240a and the second cam 240b coupled to the first set housing 110 and the second set housing 120 may be upwardly folded by approximately 90°. Here, the first protruding portions 243a and 243b of the first cam 240a and the second cam 240b may apply downwardly a pressure to the flat portion 252 (see FIG. 4B) of the support member 250. The support member 250 may downwardly move by the pressure applied to the support member 250, and the first cam 240a and the second cam 240b may be upwardly folded while the first protruding portions 243a and 243b of the first cam 240a and the second cam 240b are in contact with the flat portion 252 of the support member 250. The first flap bar 220a and the second flap bar 220b coupled through the guide holes 241 (see FIG. 4A) of the first cam 240a and the second cam 240b may also be upwardly folded. At this time, as shown in FIG. 7B, as the first cam 240a and the second cam 240b are upwardly folded, they may receive an upwardly applied force. Accordingly, the sliding pins 222a and 222b of the first flap bar 220a and the second flap bar 220b may outwardly move along the guide holes 241 of the first cam 240a and the second cam 240b, unlike the upward folding movement of the first cam 240a and the second cam 240 by approximately 90°. Therefore, the first flap bar 220a and the second flap bar 220b may not be folded by 90° and may be located more outward than the first cam 240a and the second cam 240b. Accordingly, as illustrated in FIG. 7A, a first support 112 and a second support 122 coupled to the first cam 240a and the second cam 240b may be located more inward from the first flap bar 220a and the second flap bar 220b, respectively.

Accordingly, the first support 112, the second support 122, the first flap bar 220a, and the second flap bar 220b may form a space S in an in-folded state, and the display panel 130 may have a shape of omega (Q). When the display panel 130 is in-folded in a shape of omega (Q) in the folding area, a radius of curvature may be increased so that the stress applied to the folded display panel 130 may be reduced.

Further, a curved surface of the in-folded display panel 130 may be supported by the support member 250 which may downwardly move to suppress the reduction of the radius of curvature of the display panel 130. Accordingly, a potential crease or the crack caused in the display panel corresponding to the folding layer may be suppressed even though the in-folding is repeatedly implemented.

Figure 8A:
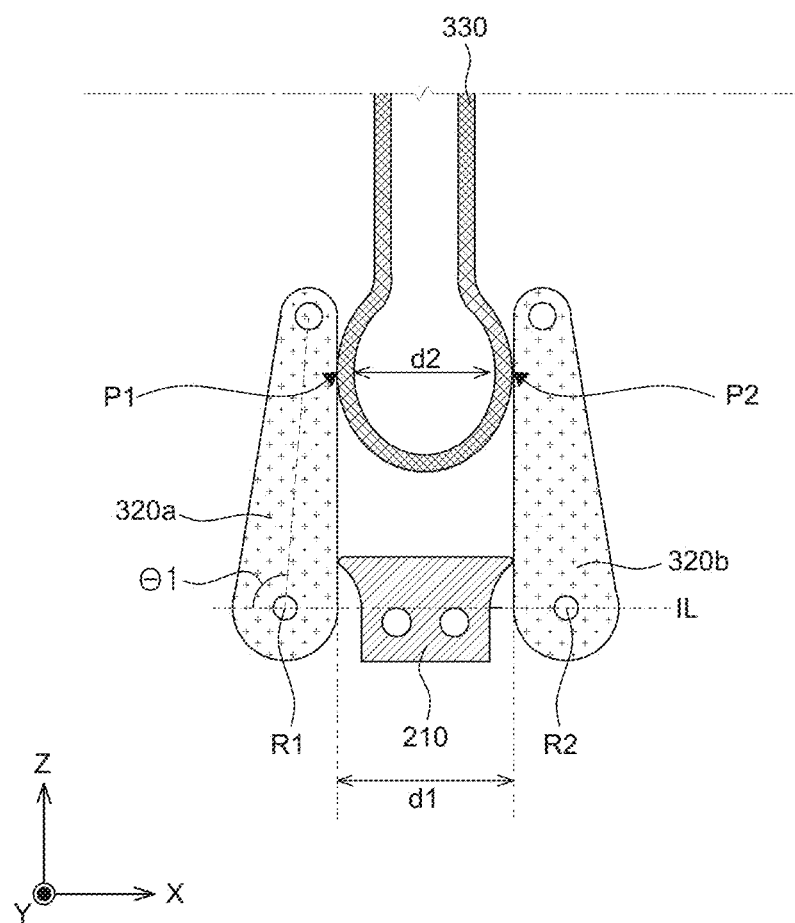
FIGS. 8A and 8B are schematic cross-sectional views illustrating an in-folded state of a foldable display apparatus according to another example embodiment of the present disclosure.
Figure 8B:
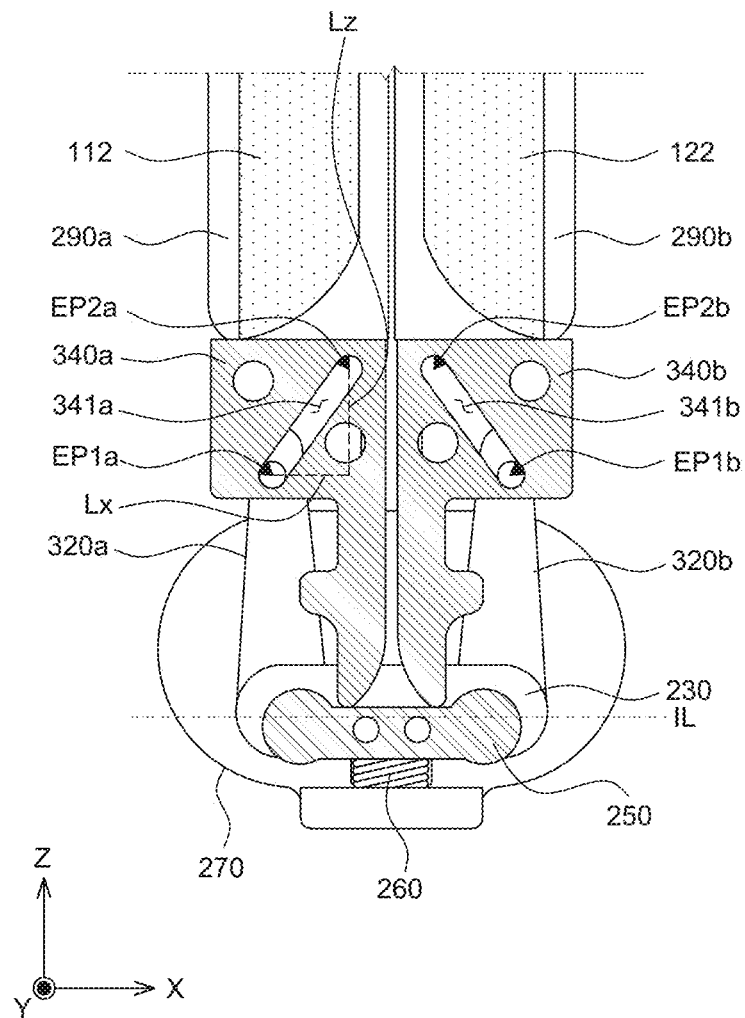

FIGS. 8A and 8B are schematic cross-sectional views illustrating an in-folded state of a foldable display apparatus according to another example embodiment of the present disclosure.

As shown in FIGS. 8A and 8B, a foldable display apparatus according to another example embodiment of the present disclosure is substantially the same as the foldable display apparatus 100 illustrated in FIGS. 7A and 7B except that a first cam 340a and a second cam 340b have different structures from the first cam 240a and the second cam 240b in FIG. 7B so that, in an in-folded state of the foldable display apparatus, a folding angle of the first flip bar 320a and the second flip bar 320b is different from that of the first flip bar 220a and the second flip bar 220b in FIGS. 7A and 7B, and a folded shape of the display panel 330 is different from the display panel 130 in FIG. 7A. Accordingly, a redundant description may be omitted.

The foldable display apparatus is illustrated in FIGS. 8A and 8B in an in-folded state, that is, the first set housing 110 and the second set housing 120 are fully folded inwardly so that the display panel 330 is disposed between them. As shown in FIGS. 8A and 8B, the first set housing 110 and the second set housing 120 may be folded by approximately 90° in an upward direction (the Z-axis direction) with respect to an unfolded state so that the display panel 330 is disposed between them. As illustrated in FIG. 8B, the first cam 340a and the second cam 340b coupled to the first set housing 110 and the second set housing 120 may be also folded in the upward direction (the Z-axis direction) by approximately 90°.

As illustrated in FIG. 8A, the display panel 330 may be folded with a shape of omega ("Q") in a space formed by a first flap bar 320a and a second flap bar 320b. Unlike the example foldable display apparatus 100 illustrated in FIG. 7A, in FIG. 8A, the foldable display apparatus may be folded such that a folding angle θ1 of the first flap bar 320a and the second flap bar 320b is larger, and an interval between the first flap bar 320a and the second flap bar 320b is smaller. To be more specific, in the in-folded state, a distance d1 between a first point P1 at which the first flap bar 320a and the display panel 330 are in contact with each other and a second point P2 at which the second flap bar 320b and the display panel 330 are in contact with each other may be in a range from 4 mm to 5 mm or from 4.3 mm to 4.7 mm. In this case, a maximum distance d2 between two upper surfaces of the display panel 330 which face each other at the first point P1 and the second point P2 may be in a range from 3.2 mm to 3.8 mm or from 3.4 mm to 3.6 mm. That is, a maximum interval d2 in the omega (Q) shape of the display panel 330 may be in a range from 3.2 mm to 3.8 mm or from 3.4 mm to 3.6 mm.

Unlike the example foldable display apparatus 100 illustrated in FIG. 7A, in the example as illustrated in FIG. 8A, if a size of the omega (Q) shape of the folded display panel 330 is reduced by adjusting the interval between the first flap bar 320a and the second flap bar 320b, a stress applied at respective points at which the display panel 330 is in contact with the first flap bar 320a and the second flap bar 320b during the out-folding may be reduced. To be more specific, with reference to FIG. 6A referenced in the above description, during the out-folding in which the first flap bar 320a and the second flap bar 320b downwardly rotate so that the display panel 330 is disposed outside, the first flap bar 320a and the second flap bar 320b may be downwardly folded. Accordingly, the respective side portions of the first flap bar 320a and the second flap bar 320b adjacent to the mid bar 210 may maintain a curved shape C rather than an angular shape. Here, the display panel 330 may be downwardly out-folded along the curved shape C formed by the first flap bar 320a and the second flap bar 320b. The display panel 330 may be in direct contact with the curved shape C formed at the respective side portions of the first flap bar 320a and the second flap bar 320b adjacent to the mid bar 210 and may be folded at a larger angle at this portion. Accordingly, a relatively large amount of stress may be concentrated on the portion where the display panel 330 is in contact with the first flap bar 320a or the second flap bar 320b. Here, on the portion where the display panel 330 is in contact with the first flap bar 320a or the second flap bar 320b during the out-folding described above, a relatively large amount of compressive strain may be applied during the in-folding. If the display panel 330 is repeatedly in-folded and out-folded, the portion may be damaged. Accordingly, in the foldable display apparatus according to another example embodiment of the present disclosure, if the maximum interval d2 in the omega (Q) shape of the display panel 330 satisfies the above-mentioned range during the in-folding, the compressive strain applied during the in-folding operation may be reduced in the portion where the display panel 330 is in contact with the first flap bar 320a or the second flap bar 320b during the out-folding. Specifically, if the maximum interval d2 in the omega (Q) shape of the display panel 330 is changed from 4.5 mm to 3.5 mm, the compressive strain applied to the portion where the display panel 330 is in contact with the first flap bar 320a or the second flap bar 320b during the in-folding operation may be reduced by 15%.

To control a structure of the display panel 330 during the in-folding, structures of the first cam 340a and the second cam 340b may be adjusted. Specifically, in the foldable display apparatus according to another example embodiment of the present disclosure, the first cam 340a and the second cam 340b illustrated in FIG. 8B may include guide holes 341a and 341b which have different shapes from those of the first cam 240a and the second cam 240b illustrated in FIG. 7B. To be more specific, the guide holes 341a and 341b of the first cam 340a and the second cam 340b illustrated in FIG. 8 respectively include first end portions EP1a and EP1b at which sliding pins of the first flap bar 320a and the second flap bar 320b may be located in the in-folded state and respectively include second end portions EP2a and EP2b at which the sliding pins may be located in the out-folded state. That is, the first end portions EP1a and EP1b are end portions of the guide holes 341a and 341b adjacent to rotation axes R1 and R2 of the first flap bar 320a and the second flap bar 320b, respectively. The second end portions EP2a and EP2b are end portions of the guide holes 341a and 341b spaced apart from the rotation axes R1 and R2 of the first flap bar 320a and the second flap bar 320b, respectively. The first end portions EP1a and EP1b may respectively determine positions of the first flap bar 320a and the second flap bar 320b during the in-folding, thereby controlling an interval between the first flap bar 320a and the second flap bar 320b.

As shown in FIG. 8B, a gradient formed by the first end portions EP1a and EP1b and the second end portions EP2a and EP2b with respect to an imaginary line IL which connects the rotation axis R1 of the first flap bar 320*a* and the rotation axis R2 of the second flap bar 320*b* may be in a range from 2 to 3 or from 2.25 to 2.75. To be more specific, a ratio of a displacement Lx of the guide holes 341*a* and 341*b* in the X-axis direction to a displacement Lz in the Z-axis direction during the in-folding may be in a range from 1:2 to 1:3 or from 2:4.5 to 2:5.5. In addition, a folding angle θ1 formed by the rotation axis R1 of the first flap bar 320*a* and the first end portion EP1*a* of the first cam 340*a* and a folding angle formed by the rotation axis R2 of the second flap bar 320*b* and the first end portion EP1*b* of the second cam 340*b* may be in a range from 93° to 97°, respectively. That is, the folding angle formed by the rotation axis R1 of the first flap bar 320*a* and a sliding pin of the first flap bar 320*a* may be in a range from 93° to 97°. As described above, the folding angles and the positions of the first flap bar 320*a* and the second flap bar 320*b* may be adjusted by the structures of the guide holes 341*a* and 341*b* of the first cam 340*a* and the second cam 340*b*. Accordingly, the shape of the folded display panel 330 located between the first flap bar 320*a* and the second flap bar 320*b* may be controlled. The amount of strain at the portion of the display panel where the largest strain may be applied during the repeated in-folding and out-folding operations may be reduced by adjusting the omega shape of the display panel 330 folded during the in-folding.

Example embodiments of the present disclosure may also be described as follows:

According to an aspect of the present disclosure, a foldable display apparatus may include: a display panel; a first set housing and a second set housing arranged in a first direction and respectively supporting two different portions of the display panel; and a hinge assembly disposed between the first set housing and the second set housing and configured to fold and unfold the first set housing and the second set housing. The hinge assembly may include: a mid bar extending between the first set housing and the second set housing in a second direction perpendicular to the first direction; a first flap bar disposed between the first set housing and the mid bar; a second flap bar disposed between the second set housing and the mid bar; a fastening member fastened with the mid bar, the first flap bar, and the second flap bar; a support member coupled to the fastening member; a first cam and a second cam disposed respectively at opposite sides of the support member in the first direction and coupled respectively with the first flap bar and the second flap bar; and a first gear arm and a second gear arm coupled respectively with the first cam and the second cam and coupled respectively with the first housing and the second housing.

In some example embodiments, each of the first set housing and the second set housing may include a support disposed below the display panel at an unfolded state, a frame disposed at an edge of the support, and a fastening unit disposed in the frame. The fastening unit of the first set housing may be fastened with the first gear arm, and the fastening unit of the second set housing may be fastened with the second gear arm.

In some example embodiments, an upper surface of the mid bar may have a flat shape, and side surfaces of the mid bar adjacent respectively to the first flap bar and the second flap bar may be inwardly recessed.

In some example embodiments, at least a part of a side portion of each of the first flap bar and the second flap bar adjacent to the mid bar may have a convex surface corresponding to a respective one of the inwardly recessed side surfaces of the mid bar. Also, the side portions of the first flap bar and the second flap bar may be fastened with the fastening member so that opposite side portions of the first flap bar and the second flap bar each may rotatably move with respective to a rotation axis at a respective one of the side portions of the first flap bar and the second flap bar.

In some example embodiments, for each of the first flap bar and the second flap bar in an out-folded state, a length V from the rotation axis to an edge of the side portion in a vertical direction and a length H from the rotation axis to an edge of the side portion in a horizontal direction satisfy the following equation:

$$\sqrt{1-\left(\frac{H}{V}\right)^2} = 0 \text{ or } 0.7 \le \sqrt{1-\left(\frac{H}{V}\right)^2}.$$

In some example embodiments, the first cam and the second cam each may include a fixing portion. The side portions of the first flap bar and the second flap bar may each be coupled to the fastening member, and the opposite side portions of the first flap bar and the second flap bar may be coupled to the fixing portions of the first cam and the second cam, respectively.

In some example embodiments, the fixing portions of the first cam and the second cam each may include a guide hole extending diagonally at 45 degrees between the first direction and the second direction. Also, the first flap bar and the second flap bar may each include a sliding pin at the opposite side portion, the sliding pin being disposed in the guide hole of a respective one of the first cam and the second cam.

In some example embodiments, the sliding pin may slidably move in the guide hole during folding and unfolding movements.

In some example embodiments, the fixing portions of the first cam and the second cam each may further include two fastening holes spaced apart from the guide hole by a same distance with the guide hole therebetween, and the two fastening holes may be fastened with a respective one of the first gear arm and the second gear arm.

In some example embodiments, the first cam and the second cam may each include: a fixing portion coupled with a respective one of the first flap bar and the second flap bar; and a pressurizing portion to apply pressure to the support member during a folding movement.

In some example embodiments, the support member may include a flat portion at an upper surface and a circular arc portion at each side of the flat portion and having a convex surface. The pressurizing portion may include a first protruding portion protruding from the fixing portion in the first direction, a second protruding portion protruding in a direction perpendicular to the first protruding portion, and a curved portion between the first protruding portion and the second protruding portion.

In some example embodiments, during an in-folding movement to fold the display panel inwardly, the fixing portions of the first cam and the second cam may apply a pressure on the flat portion of the support member to downwardly move the support member.

In some example embodiments, the hinge assembly may further include a spring member disposed below the support member. Also, during an out-folding movement to fold the display panel outwardly, the fixing portions of the first cam and the second cam may be spaced apart from the flat portion of the support member, and the spring member may maintain the support member in place without moving up and down.

In some example embodiments, the hinge assembly may further include: a spring member disposed below the support member; a first rotary gear and a second rotary gear coupled to the first gear arm and the second gear arm, respectively; and a gear housing accommodating the first rotary gear and the second rotary gear. The gear housing may include a support portion extending to the support member, and the spring member may be disposed on the support portion.

In some example embodiments, the gear housing may include a guide groove facing the support member, and the support member may include a protruding portion disposed in the guide groove to move up and down along the guide groove.

In some example embodiments, the display panel may have a shape of omega (Ω) in an in-folded state in which the display panel is disposed between the first set housing and the second set housing.

In some example embodiments, in the in-folded state, an interval between a first point at which the first flap bar is in contact with the display panel and a second point at which the second flap bar is in contact with the display panel may be in a range from 4 mm to 5 mm.

In some example embodiments, a maximum distance between two opposing upper surfaces of the display panel facing each other at the first point and the second point, respectively, may be in a range from 3.2 mm to 3.8 mm.

In some example embodiments, respective side portions of the first flap bar and the second flap bar adjacent to the mid bar may be fastened with the fastening member, and other respective side portions of the first flap bar and the second flap bar may be coupled respectively to fixing units of the first cam and the second cam. The fixing units of the first cam and the second cam each may include a guide hole to allow a sliding pin formed at the other side portion of a corresponding one of the first flap bar and the second flap bar to slidably move. The guide hole may include a first end portion at which the sliding pin is located with the display panel in an in-folded state in which the display panel is disposed between the first set housing and the second set housing; and a second end portion at which the sliding pin is located with the display panel in an out-folded operation state in which the first set housing and the second set housing are disposed between a folded surface of the display panel.

In some example embodiments, in the in-folded state, a folding angle formed by the rotation axis of the first flap bar and the first end portion of the first cam and a folding angle formed by the rotation axis of the second flap bar and the first end portion of the second cam may each be in a range from 93° to 97°.

In some example embodiments, in the in-folded state, a gradient formed by the first end portion and the second end portion with respect to an imaginary line connecting the rotation axis of the first flap bar and the rotation axis of the second flap bar may be in a range from 2.25 to 2.75.

In another aspect of the present disclosure, a foldable display apparatus may include: a display panel; a first set housing and a second set housing arranged in a first direction and supporting the display panel; and a hinge assembly disposed between and connected to the first set housing and the second set housing. The hinge assembly may be configured to: rotate the first set housing and the second set housing inward to in-fold the display panel so that the display panel is disposed between the first set housing and the second set housing; rotate the first set housing and the second set housing outward to out-fold the display panel so that the first set housing and the second set housing are disposed between the out-folded display panel; and position the first set housing and the second set housing flat to unfold the display panel so that the display panel is flat on the first set housing, the second set housing, and the hinge assembly.

In some example embodiments, the hinge assembly may include: a mid bar extending between the first set housing and the second set housing in a second direction perpendicular to the first direction; a first flap bar disposed between the first set housing and the mid bar; a second flap bar disposed between the second set housing and the mid bar; and a first cam and a second cam coupled respectively with the first flap bar and the second flap bar.

In some example embodiments, the hinge assembly may further include: a fastening member fastened with the mid bar, the first flap bar, and the second flap bar; a support member coupled to the fastening member. The first cam and the second cam may be disposed respectively at opposite sides of the supporting member in the first direction.

In some example embodiments, the hinge assembly may further include: a first gear arm and a second gear arm coupled respectively with the first cam and the second cam and coupled respectively with the first housing and the second housing; and a first rotary gear and a second rotary gear coupled with the first gear arm and the second gear arm respectively, the first rotary gear and the second rotary gear being configured to support in-folding, out-folding, and unfolding movements of the display panel.

In some example embodiments, a folded portion of the display panel may have an omega (Ω) shape in an in-folded state.

Although example embodiments of the present disclosure have been described in detail with reference to the accompanying drawings, the present disclosure is not limited thereto and may be embodied in many different forms without departing from the technical concept of the present disclosure. Therefore, example embodiments of the present disclosure are provided for illustrative purposes only but not intended to limit the technical concept of the present disclosure.

The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

It will be apparent to those skilled in the art that various modifications and variations can be made in the present disclosure without departing from the technical idea or scope of the disclosures. Thus, it is intended that embodiments of the present disclosure cover the modifications and variations of the disclosure provided they come within the scope of the appended claims and their equivalents.

What is claimed is:
1. A foldable display apparatus, comprising:
a display panel;
a first set housing and a second set housing arranged in a first direction and respectively supporting two different portions of the display panel; and
a hinge assembly disposed between the first set housing and the second set housing and configured to fold and unfold the first set housing and the second set housing, the hinge assembly including:
- a mid bar extending between the first set housing and the second set housing in a second direction perpendicular to the first direction;
- a first flap bar disposed between the first set housing and the mid bar;
- a second flap bar disposed between the second set housing and the mid bar;
- a fastening member fastened with the mid bar, the first flap bar, and the second flap bar;
- a support member coupled to the fastening member;
- a first cam and a second cam disposed respectively at opposite sides of the support member in the first direction and coupled respectively with the first flap bar and the second flap bar; and
- a first gear arm and a second gear arm coupled respectively with the first cam and the second cam and coupled respectively with the first set housing and the second set housing, wherein the mid bar comprises a plurality of insertion holes fastened with the fastening member in the second direction.

2. The foldable display apparatus of claim 1, wherein each of the first set housing and the second set housing includes:
- a support disposed below the display panel at an unfolded state, a frame disposed at an edge of the support, and a fastening unit disposed in the frame,
- wherein the fastening unit of the first set housing is fastened with the first gear arm, and the fastening unit of the second set housing is fastened with the second gear arm.

3. The foldable display apparatus of claim 1, wherein an upper surface of the mid bar has a flat shape, and side surfaces of the mid bar adjacent respectively to the first flap bar and the second flap bar are inwardly recessed.

4. The foldable display apparatus of claim 3, wherein at least a part of a side portion of each of the first flap bar and the second flap bar adjacent to the mid bar has a convex surface corresponding to a respective one of the inwardly recessed side surfaces of the mid bar, and
- wherein the side portions of the first flap bar and the second flap bar are fastened with the fastening member so that opposite side portions of the first flap bar and the second flap bar each rotatably move with respective to a rotation axis at a respective one of the side portions of the first flap bar and the second flap bar.

5. The foldable display apparatus of claim 4, wherein for each of the first flap bar and the second flap bar in an out-folded state, a length V from the rotation axis to an edge of the side portion in a vertical direction and a length H from the rotation axis to an edge of the side portion in a horizontal direction satisfy the following equation:

$$\sqrt{1-\left(\frac{H}{V}\right)^2} = 0 \text{ or } 0.7 \leq \sqrt{1-\left(\frac{H}{V}\right)^2}.$$

6. The foldable display apparatus of claim 4, wherein the first cam and the second cam each include a fixing portion, and
- wherein the side portions of the first flap bar and the second flap bar are each coupled to the fastening member, and the opposite side portions of the first flap bar and the second flap bar are coupled to the fixing portions of the first cam and the second cam, respectively.

7. The foldable display apparatus of claim 6, wherein the fixing portions of the first cam and the second cam each include a guide hole extending diagonally at 45 degrees between the first direction and the second direction, and
- wherein the first flap bar and the second flap bar each include a sliding pin at the opposite side portion, the sliding pin being disposed in the guide hole of a respective one of the first cam and the second cam.

8. The foldable display apparatus of claim 7, wherein the sliding pin slidably moves in the guide hole during folding and unfolding movements.

9. The foldable display apparatus of claim 7, wherein the fixing portions of the first cam and the second cam each further include two fastening holes spaced apart from the guide hole by a same distance with the guide hole therebetween, and the two fastening holes are fastened with a respective one of the first gear arm and the second gear arm.

10. The foldable display apparatus of claim 1, wherein the first cam and the second cam each include:
- a fixing portion coupled with a respective one of the first flap bar and the second flap bar; and
- a pressurizing portion to apply pressure to the support member during a folding movement.

11. The foldable display apparatus of claim 10, wherein the support member includes a flat portion at an upper surface and a circular arc portion at each side of the flat portion and having a convex surface, and
- wherein the pressurizing portion includes a first protruding portion protruding from the fixing portion in the first direction, a second protruding portion protruding in a direction perpendicular to the first protruding portion, and a curved portion between the first protruding portion and the second protruding portion.

12. The foldable display apparatus of claim 11, wherein during an in-folding movement to fold the display panel inwardly, the fixing portions of the first cam and the second cam apply a pressure on the flat portion of the support member to downwardly move the support member.

13. The foldable display apparatus of claim 11, wherein the hinge assembly further includes a spring member disposed below the support member, and
- wherein during an out-folding movement to fold the display panel outwardly, the fixing portions of the first cam and the second cam are spaced apart from the flat portion of the support member, and the spring member maintains the support member in place without moving up and down.

14. The foldable display apparatus of claim 1, wherein the hinge assembly further includes:
- a spring member disposed below the support member;
- a first rotary gear and a second rotary gear coupled to the first gear arm and the second gear arm, respectively; and
- a gear housing accommodating the first rotary gear and the second rotary gear,
- wherein the gear housing includes a support portion extending to the support member, and the spring member is disposed on the support portion.

15. The foldable display apparatus of claim 14, wherein the gear housing includes a guide groove facing the support member, and
- wherein the support member includes a protruding portion disposed in the guide groove to move up and down along the guide groove.

16. The foldable display apparatus of claim 1, wherein the display panel has a shape of omega (Ω) in an in-folded state in which the display panel is disposed between the first set housing and the second set housing.

17. The foldable display apparatus of claim 16, wherein, in the in-folded state, an interval between a first point at which the first flap bar is in contact with the display panel and a second point at which the second flap bar is in contact with the display panel is in a range from 4 mm to 5 mm.

18. The foldable display apparatus of claim 17, wherein a maximum distance between two opposing upper surfaces of the display panel facing each other at the first point and the second point, respectively, is in a range from 3.2 mm to 3.8 mm.

19. The foldable display apparatus of claim 1, wherein:
respective side portions of the first flap bar and the second flap bar adjacent to the mid bar are fastened with the fastening member, and other respective side portions of the first flap bar and the second flap bar are coupled respectively to fixing units of the first cam and the second cam,
the fixing units of the first cam and the second cam each includes a guide hole to allow a sliding pin formed at the other respective side portion of a corresponding one of the first flap bar and the second flap bar to slidably move, and
the guide hole includes:
a first end portion at which the sliding pin is located with the display panel in an in-folded state in which the display panel is disposed between the first set housing and the second set housing; and
a second end portion at which the sliding pin is located with the display panel in an out-folded operation state in which the first set housing and the second set housing are disposed between a folded surface of the display panel.

20. The foldable display apparatus of claim 19, wherein, in the in-folded state:
a folding angle formed by a rotation axis of the first flap bar and the first end portion of the first cam and a folding angle formed by a rotation axis of the second flap bar and the first end portion of the second cam are each in a range from 93° to 97°.

21. The foldable display apparatus of claim 19, wherein, with the display panel in the in-folded state, a gradient formed by the first end portion and the second end portion with respect to an imaginary line connecting a rotation axis of the first flap bar and a rotation axis of the second flap bar is in a range from 2.25 to 2.75.

22. A foldable display apparatus, comprising:
a display panel;
a first set housing and a second set housing arranged in a first direction and supporting the display panel; and
a hinge assembly disposed between and connected to the first set housing and the second set housing, the hinge assembly being configured to:
rotate the first set housing and the second set housing inward to in-fold the display panel so that the display panel is disposed between the first set housing and the second set housing;
rotate the first set housing and the second set housing outward to out-fold the display panel so that the first set housing and the second set housing are disposed between the out-folded display panel; and
position the first set housing and the second set housing flat to unfold the display panel so that the display panel is flat on the first set housing, the second set housing, and the hinge assembly,
wherein the hinge assembly includes:
a mid bar extending between the first set housing and the second set housing in a second direction perpendicular to the first direction;
a first flap bar disposed between the first set housing and the mid bar;
a second flap bar disposed between the second set housing and the mid bar;
a fastening member fastened with the mid bar, the first flap bar, and the second flap bar;
wherein the mid bar comprises a plurality of insertion holes fastened with the fastening member in the second direction.

23. The foldable display apparatus of claim 22, wherein the hinge assembly further includes:
a first cam and a second cam coupled respectively with the first flap bar and the second flap bar.

24. The foldable display apparatus of claim 23, wherein the hinge assembly further includes:
a support member coupled to the fastening member,
wherein the first cam and the second cam are disposed respectively at opposite sides of the support member in the first direction.

25. The foldable display apparatus of claim 24, wherein the hinge assembly further includes:
a first gear arm and a second gear arm coupled respectively with the first cam and the second cam and coupled respectively with the first set housing and the second set housing; and
a first rotary gear and a second rotary gear coupled with the first gear arm and the second gear arm respectively, the first rotary gear and the second rotary gear being configured to support in-folding, out-folding, and unfolding movements of the display panel.

26. The foldable display apparatus of claim 22, wherein a folded portion of the display panel has an omega (Ω) shape in an in-folded state.

* * * * *